United States Patent
Schunk

(10) Patent No.: US 7,371,012 B2
(45) Date of Patent: May 13, 2008

(54) OPTOELECTRONIC MODULE AND PLUG ARRANGEMENT

(75) Inventor: Nikolaus Schunk, Maxhütte-Haidhof (DE)

(73) Assignee: Infineon Technologies AG, Munich (DE)

( * ) Notice: Subject to any disclaimer, the term of this patent is extended or adjusted under 35 U.S.C. 154(b) by 116 days.

(21) Appl. No.: 10/507,298

(22) PCT Filed: Mar. 8, 2002

(86) PCT No.: PCT/DE02/00904

§ 371 (c)(1),
(2), (4) Date: Jul. 12, 2005

(87) PCT Pub. No.: WO03/076998

PCT Pub. Date: Sep. 18, 2003

(65) Prior Publication Data

US 2006/0013542 A1    Jan. 19, 2006

(51) Int. Cl.
*G02B 6/36* (2006.01)
*G02B 6/12* (2006.01)
*G02B 6/32* (2006.01)

(52) U.S. Cl. .............. 385/88; 385/14; 385/33
(58) Field of Classification Search ........... 385/88, 385/14, 33
See application file for complete search history.

(56) References Cited

U.S. PATENT DOCUMENTS

| | | | |
|---|---|---|---|
| 5,259,052 A | | 11/1993 | Briggs et al. |
| 5,348,487 A | | 9/1994 | Marazzi et al. |
| 5,548,676 A | | 8/1996 | Savage, Jr. |
| 5,768,456 A | | 6/1998 | Knapp et al. |
| 5,879,173 A | * | 3/1999 | Poplawski et al. ......... 439/138 |
| 5,960,141 A | * | 9/1999 | Sasaki et al. ............... 385/88 |
| 6,014,476 A | | 1/2000 | Meyer-Guldner et al. |
| 6,267,606 B1 | * | 7/2001 | Poplawski et al. ........... 439/92 |
| 6,309,566 B1 | * | 10/2001 | Muller et al. .............. 264/1.25 |
| 6,422,766 B1 | * | 7/2002 | Althaus et al. .............. 385/94 |
| 6,551,117 B2 | * | 4/2003 | Poplawski et al. ........... 439/92 |

(Continued)

FOREIGN PATENT DOCUMENTS

DE    295 03 807.1 U1    6/1995

(Continued)

OTHER PUBLICATIONS

Mason, Kenneth "Fiber Optic Module Interface Attachment" Research Disclosure, Emsworth, GB, No. 330, Oct. 10, 1991, pp. 762.

*Primary Examiner*—K. Cyrus Kianni
(74) *Attorney, Agent, or Firm*—Eschweiler & Associates, LLC

(57) ABSTRACT

A compact optoelectronic module that prevents undesirable heating by locating the electrical drive and/or receiving (control) circuit outside of the housing containing the optoelectronic transducer. The control circuit is mounted on a submount (PCB). The housing is mounted on the submount adjacent to the control circuit, and the optoelectronic transducer is coupled to the control circuit via a mount (leadframe) that extends substantially perpendicular to the submount plane and is surface mounted on the submount. The housing includes an opening, and a lens is provided between the optoelectronic transducer and the opening and defines an optical axis that is parallel to the submount plane. An encapsulating body is used to secure the optoelectronic transducer and mount inside the housing, and a portion of the encapsulating material is used to form the lens.

18 Claims, 11 Drawing Sheets

U.S. PATENT DOCUMENTS

| | | | |
|---|---|---|---|
| 6,890,206 B2* | 5/2005 | Distad et al. | 439/372 |
| 7,050,678 B1* | 5/2006 | Isono et al. | 385/39 |
| 2002/0009905 A1* | 1/2002 | Poplawski et al. | 439/76.1 |
| 2002/0142634 A1* | 10/2002 | Poplawski et al. | 439/98 |
| 2003/0026168 A1* | 2/2003 | Behn et al. | 367/76 |
| 2003/0171022 A1* | 9/2003 | Distad et al. | 439/372 |
| 2004/0127102 A1* | 7/2004 | Poplawski et al. | 439/630 |

FOREIGN PATENT DOCUMENTS

| | | |
|---|---|---|
| DE | 199 09 242 A1 | 8/2000 |
| EP | 0 232 792 A1 | 8/1987 |
| EP | 0 331 436 A2 | 9/1989 |
| EP | 0 613 030 A2 | 8/1994 |
| JP | 63133683 | 6/1988 |

* cited by examiner

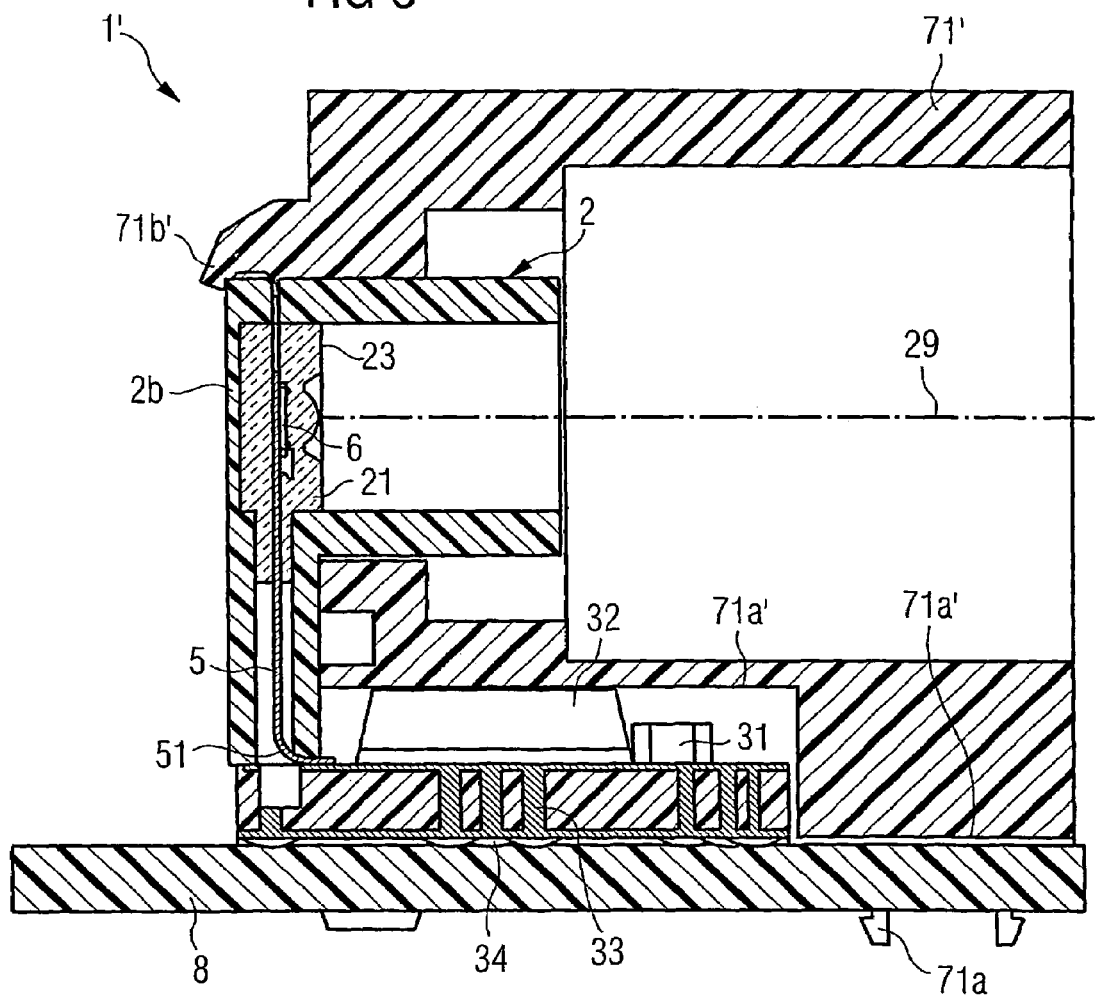

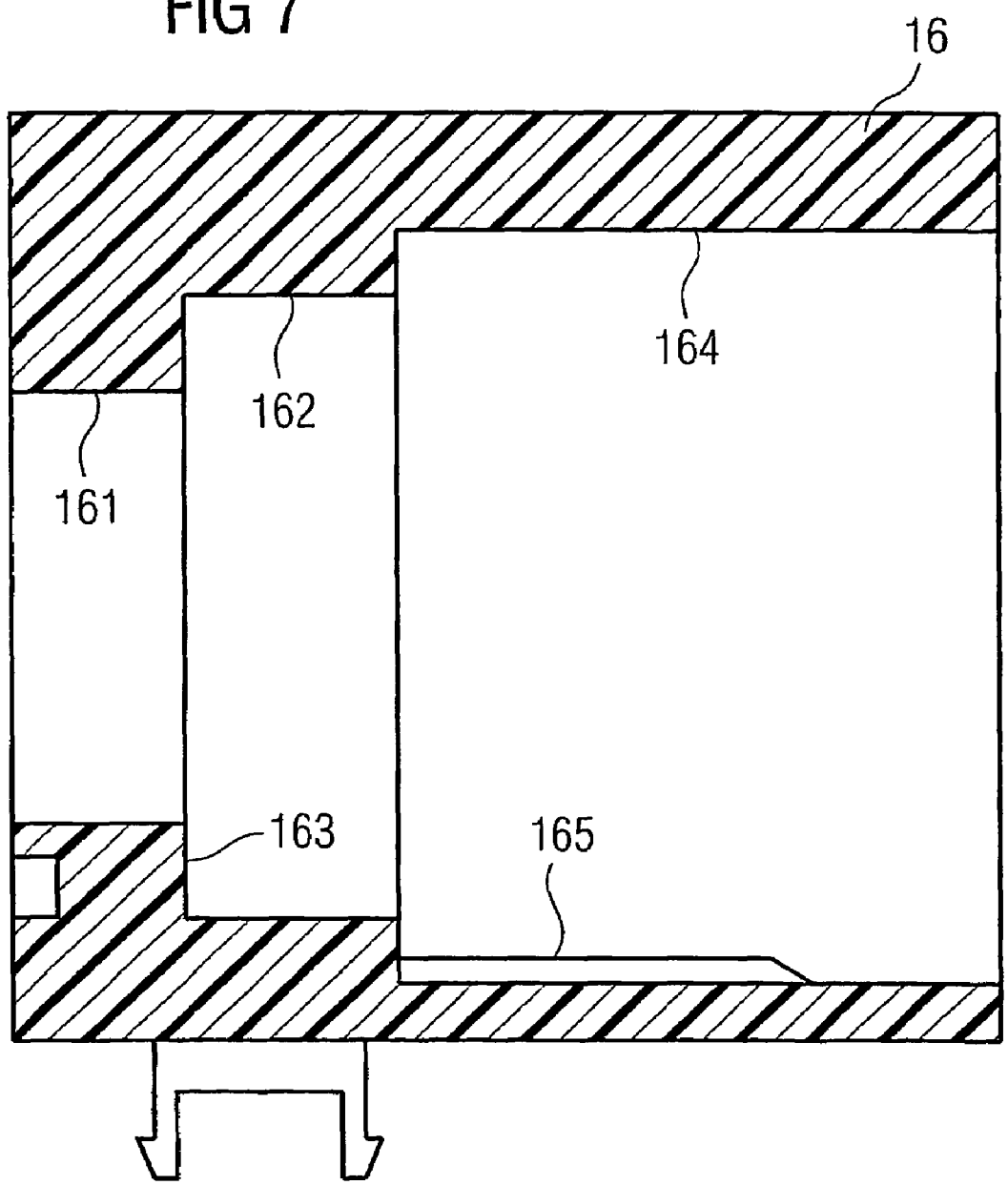

OPTOELECTRONIC MODULE AND PLUG ARRANGEMENT

FIELD OF THE INVENTION

The invention relates generally to optoelectronic modules, and more particularly to a plug arrangement used in conjunction with an optoelectronic module. One preferred field of application of the invention is low-cost optoelectronic modules which are coupled to POF (Plastic Optical Fiber) optical waveguides. Within this preferred field of application, the invention is particularly suitable for use in multimedia networks, in the in-house area and automotive area.

BACKGROUND OF THE INVENTION

DE 199 09 242 A1 discloses an optoelectronic module in which a mount with an optoelectronic transducer is positioned in a module housing and is encapsulated by means of a translucent material which can be shaped. The light is injected or output via an optical fiber, which is coupled to a connecting stub on the module housing. The driver module and the receiving module for the optoelectronic transducer are also located on the mount.

The data rates for POF transmission systems are rising increasingly. So-called RCLEDs (Resonant Cavity LEDs) with data rates of up to 500 Mbit/s are thus being used increasingly. These RCLEDs have the disadvantage that they have a resonant-like behavior in the temperature range from about −40° C. to 85° C. In particular, there is a considerable reduction in power at the upper temperature limit. These reductions in power can be decreased by circuitry measures on the driver module.

In the case of transceiver embodiments in which the driver module is encapsulated in the encapsulation body with the RCLED, it is, however, impossible to implement appropriate circuitry measures. Firstly, it is difficult to additionally accommodate the external circuitry in the encapsulation body and to carry out the wiring. Secondly, a large amount of heat is developed, because the driver stage and the optical transmission source draw more current at high data rates, and because of the additional external circuitry. This heating can lead to clouding or blackening of the encapsulation body, and to destruction of the transducer module.

The only known way until now to reduce undesirable heating has been to restrict the temperature range to 0° C. to about 60° C. External circuitry which reduces the reductions in the power of the transducer module are also dispensed within the case of transducer modules which are encapsulated in an encapsulation body. Obviously, this is not satisfactory.

U.S. Pat. No. 5,768,456 describes an optoelectronic module having a transmitting and/or receiving element which is arranged on a flexible substrate. The flexible substrate is connected to a printed circuit board. A holding is provided for holding an optical waveguide which can be coupled to the transmitting and/or receiving element, and the holder is likewise arranged on the printed circuit board.

U.S. Pat. No. 5,259,052 discloses an optical plug arrangement, in which an optical plug has a protective bracket which can be moved in the longitudinal direction with respect to the optical waveguides. During insertion of the optical plug into a lug housing, the protective bracket, is moved relative to the optical waveguides, so that they project beyond the protective bracket.

SUMMARY OF THE INVENTION

The present invention is directed to an optoelectronic module which is distinguished by being physically compact. The aim in this case is to prevent undesirable heating caused by electrical circuits. A further aim is to provide a plug arrangement for POF transmission systems, which allows optical fibers to be connected to a optoelectronic module.

Accordingly, provision is made that, in the case of an optoelectronic module, the electrical drive and/or receiving circuit is arranged outside the holding and coupling part for the transmitting and/or receiving element, to be precise on a submount which lies on a plane which runs parallel to the longitudinal axis of the coupling area. The mount for the optoelectronic module on which the transmitting and/or receiving element is arranged in this case runs at right angles to the submount. The separation of the optical transducer (transmitting and/or receiving element) from the electrical circuitry allows each of these components to be optimized individually. In this case, only the transmitting and/or receiving element and, possibly additionally a monitor diode are/is accommodated in the holding and coupling part. The transmitting and/or receiving element is sheathed by an encapsulation material.

This results in a small, transparent encapsulation body, which has a largely homogeneous expansion behavior. Only minor stresses occur in the encapsulation body over the maximum temperature range from −40° C. to +85° C., as is required in automotive applications, thus considerably improving the fatigue life.

The arrangement of the submount parallel to the longitudinal axis or optical axis of the coupling area allows the submount to be arranged directly on a main circuit board. The submount together with the electrical drive and/or receiving circuit in this case represents a unit which can be tested in advance. It should be mentioned that the electrical drive and/or receiving circuit may also have the additional electrical circuitry mentioned initially, in addition to the actual transducer module or receiving module, thus making it possible to reduce the resonant-like behavior of the transducer module, in particular of an RCLED.

In one preferred refinement of the invention, the holding and coupling part forms a cylindrical cutout, one of whose ends contains the transmitting and/or receiving element, and whose other end forms the coupling area for an optical fiber. The holding and coupling part is accordingly essentially a cylinder, at one of whose ends the transmitting and/or receiving element is arranged in the encapsulation material, and whose other end is used to hold an optical fiber. The optical axis of the transmitting and/or receiving element is in this case located on the longitudinal axis of the cylinder or coupling area. The inner wall of the cylinder is used in a simple manner for passive fiber guidance and for fixing the fiber with respect to transverse deflections.

The mount for the transmitting and/or receiving element is preferably a leadframe, which provides the electrical link for the transmitting and/or receiving element (in particular by means of bonding wires between the individual contacts of the leadframe and the transmitting and/or receiving element). The leadframe is in this case electrically connected to the submount, and for this purpose has an area at one of its ends which is bent through 90° and is mounted on the submount. At least in the area of the holding and coupling part, the leadframe preferably runs at right angles to the longitudinal axis of the coupling area or to the lane on which the submount is arranged.

The encapsulation material in the holding and coupling part preferably forms an integrated lens on the side facing the coupling area. For this purpose, a filling closure is inserted into the coupling area before the filling process, on whose end surface the coupling lens is formed in negative form. Once the holding and coupling part has been filled with the encapsulation material and the material has been cured, the filling closure is removed again, with the desired coupling lens being integrated in the encapsulation material.

The integrated form of a lens in the encapsulation body increases the injected transmission power and the received power which is imaged on a receiving element.

A fiber stop ring is furthermore preferably provided in the encapsulation material around the lens in order to prevent the end surface of an optical fiber which is inserted into the coupling area being able to touch the lens apex of the lens. The fiber stop ring also leads to positioning in the longitudinal direction of the coupling area, thus resulting in fiber guidance on all three spatial axes.

In one preferred refinement of the invention, the optoelectronic module is mechanically coupled to a plug holder. The coupling is in this case provided via the outer wall of the holding and coupling part. Self-coupling structures may be provided in this case, allowing simple and automatic coupling between the holding and coupling parts and the plug housing. During insertion of a plug into the plug holder, the corresponding optical fiber is inserted into the coupling area of the holding and coupling part.

It is also possible to provide for the module to be mechanically coupled to a naked fiber adaptor. The optical fiber is in this case, for example, firmly clamped by means of clamp in an area of the naked fiber adaptor which is in the form of a trough. It is also possible to provide for the naked fiber adaptor to be formed integrally with the holding and coupling part, and to be formed by an extension of the cylindrical coupling area of the holding and coupling part. The arrangement of a naked fiber adaptor represents a physically simple and low-cost variant for coupling the optical fiber to the optoelectronic module.

In a further preferred refinement of the invention, the submount can be mounted on a main circuit board, in particular by mounting the submount on the main circuit board as a surface mount device (SMD). The main circuit board is in this case preferably used as a heat sink for the submount and for the electrical modules arranged on it. For this purpose, the submount preferably has plated holes which, in addition to electrical connection, also provide heat conduction between the electrical components on the submount and the main circuit board. Solder pad contacts are provided in particular on the lower face of the submount, via which the submount is mounted by SMD mounting on the main circuit board.

Lithographic circuit wiring techniques allow the electrical submount to be very compact, so that the entire transceiver structure has a width of less than 13.5 mm and thus satisfies the industry criterion of a "small form factor". The submount and the holding and coupling part are arranged alongside one another or else one above the other on the main circuit board, with the holding and coupling part possibly being held by further structures such as a plug housing.

The holding and coupling part and/or the submount preferably have/has self-coupling structures which allow automatic adjustment between these parts and/or with respect to a main circuit board. Corresponding structures may also be provided on a plug housing or on a naked fiber adaptor.

The electrical contacts on the lower face of the submount are preferably designed such that they are as far apart from one another as possible, for example being offset. The makes it possible to design a plug housing or a naked fiber adaptor, to which the holding and coupling part is connected, with clamping structures on the lower face such that the module is fixed by the optoelectronic module being latched in on a main circuit board such that the solder connections between the submount and the main circuit board are already pre-adjusted. The module is finally fixed on the main circuit board in a subsequent soldering process.

The lower face of the submount and of the plug housing and/or of a naked fiber adaptor are thus designed such that plugging the module onto a main circuit board leads to precise initial adjustment, and the module can be fixed in a subsequent soldering process without any bad electrical contacts occurring.

In one preferred refinement, a housing cover is provided, which surrounds the submount and/or one end of the holding and coupling part. For electromagnetic shielding, the holding and coupling part and/or the abovementioned housing cover are/is provided with an electrically conductive layer. Alternatively, the holding and coupling part and/or the housing cover are/is composed of an electrically conductive plastic material which, by way of example, is produced by adding small electrically conductive balls to the plastic, and which is known per se.

The housing cover of the holding and coupling part as well as the ground layer on the submount form a cage, which prevents or greatly reduces incident interference radiation.

In a further refinement of the invention, the holding and coupling part is in the form of a double chamber, which has a transmitting element and a receiving element in parallel, separate areas. Each of these parallel areas in turn has its own coupling area, via which an optical fiber is connected. In this refinement, two submounts are preferably provided, one submount in each case for the transmitting element and one submount for the receiving element. A common housing cover, which is provided with an electrically conductive layer, in this case preferably separates the two submounts, thus preventing electrical crosstalk.

A second aspect of the invention provides a plug arrangement with a plug housing and a housing associated with the plug. The plug arrangement is particularly suitable in conjunction with the optoelectronic module as claimed in claim 1, with the external contour of the holding and coupling part being coupled to the plug holder.

On the basis of the solution according to the invention, the plug has a protective bracket which can move relative to the housing of the plug, and which has at least one opening for an optical fiber in the plug. When it is not inserted, the protective bracket is arranged as protection in front of the optical fiber which projects out of the plug housing.

The plug housing which can be coupled to the plug has three steps, in that it has three areas whose internal diameters differ, between which a first and a second step stop are formed, with the first step on the plug housing acting as a stop for the protective bracket, so that the protective bracket is moved from the locking position to the first step stop during insertion of the plug into the plug housing, and is moved in the direction of the housing, with the at least one optical fiber projecting out of the corresponding opening in the protective bracket. The second step stop is used as a stop for the end face of the housing of the plug.

The arrangement of a protective bracket allows "blind" insertion, as is frequently required in automotive designs, and which in the process protects the fiber and surface against dirt.

The so-called "Kuchiri" criterion is known for this purpose: the fiber is protected in a type of "scabbard" (Japanese: Kuchiri) such that the fiber cannot project out of the protective environment until the plug has been introduced into the plug housing, so that it is positioned in front of the appropriate transducer without becoming dirty.

The plug preferably has two optical fibers, whose center axes are separated by 5 mm. The plug in this case preferably has a width of 13.5 mm, so that it satisfies the industry "small form factor" standard.

The protective bracket is preferably attached to the plug housing by means of attachment arms, with the attachment arms being mounted on the plug housing such that they are sprung and can be moved. By way of example, two such attachment arms are provided and project at right angles from that surface of the protective bracket which is arranged in front of the ends of the optical fibers.

In this case, the latching arms may have latching elements, via which the plug can be latched in the plug housing.

BRIEF DESCRIPTION OF THE FIGURES

The invention will be explained in more detail in the following text using a number of exemplary embodiments and with reference to the figures of the drawing, in which:

FIG. 3 shows a second exemplary embodiment of an optoelectronic module which is coupled to a plug housing;

FIG. 7 shows a section view of a plug housing of a plug arrangement for a POF transmission system;

DETAILED DESCRIPTION OF THE PREFERRED EMBODIMENT

Figure 1:
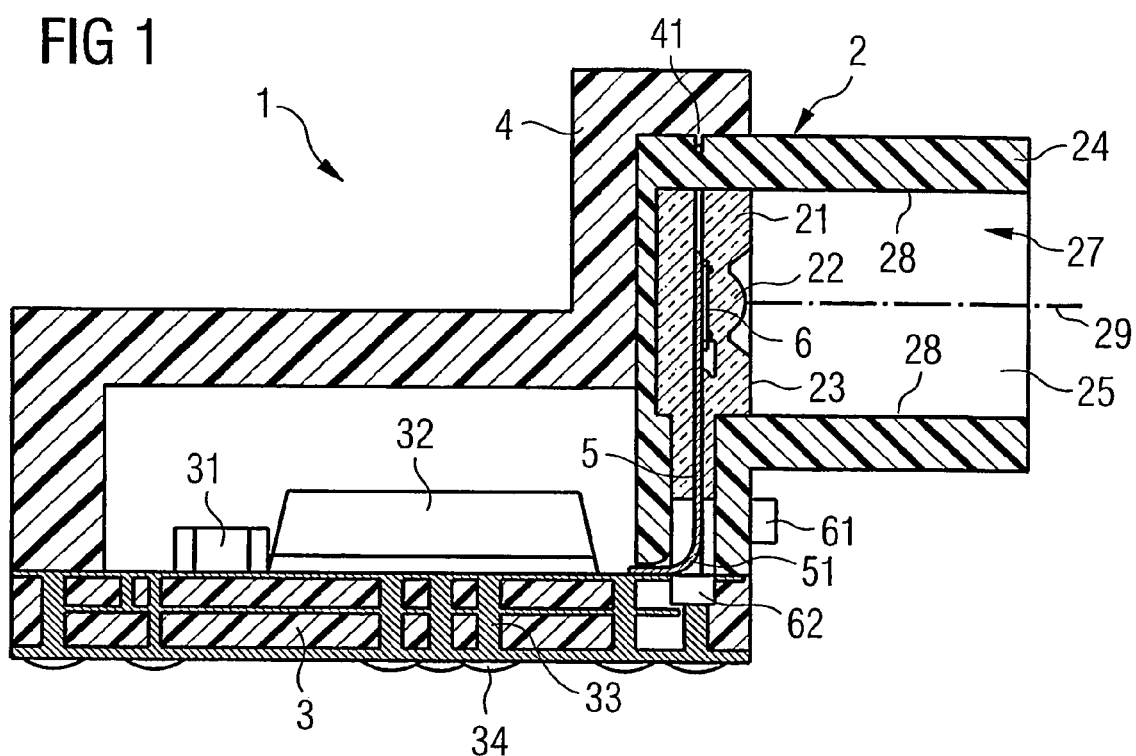
FIG. 1 shows a first exemplary embodiment of an optoelectronic module, in the form of a section illustration.

FIG. 1 shows an optoelectronic module 1 whose main components are a holding and coupling part 2, which is also referred to as a CAI (Cavity As Interface) housing, and a submount 3 with electrical components. The arrangement of the CAI housing 2 and submount 3 is covered by a housing cover 4. The housing cover is connected to the CAI housing 2 in an interlocking manner via a projection 41.

The CAI housing 2 is used firstly for holding and for insertion of a mount (lead structure) 5 with a transmitting and/or receiving element, which is in this case an optoelectronic transducer 6, and secondly for forming a coupling area 27 for holding an optical fiber. For this purpose, at one of its ends, the CAI housing has an encapsulation body 21 composed of transparent encapsulation material, which sheaths (secures) the mount 5 together with the optoelectronic transducer 6, which may be in the form of a transmitting element or a receiving element.

On the other hand, lens 22 is integrated in one piece in the transparent encapsulation body 21 in order to increase the light transmission power which can be injected into an optical fiber by means of a transmitting element or to increase the received light power imaged onto to a photodiode.

Furthermore, the encapsulation body 21 forms a fiber stop ring or protective ring 23, which protects the integrated lens 22 against being adversely mechanically affected by touching the fiber.

The CAI housing 2 is essentially in the form of a cylinder 24, which surrounds a cylindrical cutout (opening) 25. The encapsulation body 21 is located at one end of the cylindrical cutout. The area 27 of the cylindrical cutout which is adjacent to it is used together with the inner wall 28 of the cylinder 24 for passive guidance and for fixing with respect to transverse deflections of an optical fiber which can be inserted into the cylindrical cutout 25.

The transmitting and/or receiving element 6 is in this case centered with respect to (i.e., intersects) the optical axis 29 of the CAI housing.

The mount 5 is in the form of a leadframe which is aligned at right angles to the optical axis 29 and is soldered at its lower end 51 (which is bent through 90°) by means of an SMD contact to the submount 3.

Figure 2:
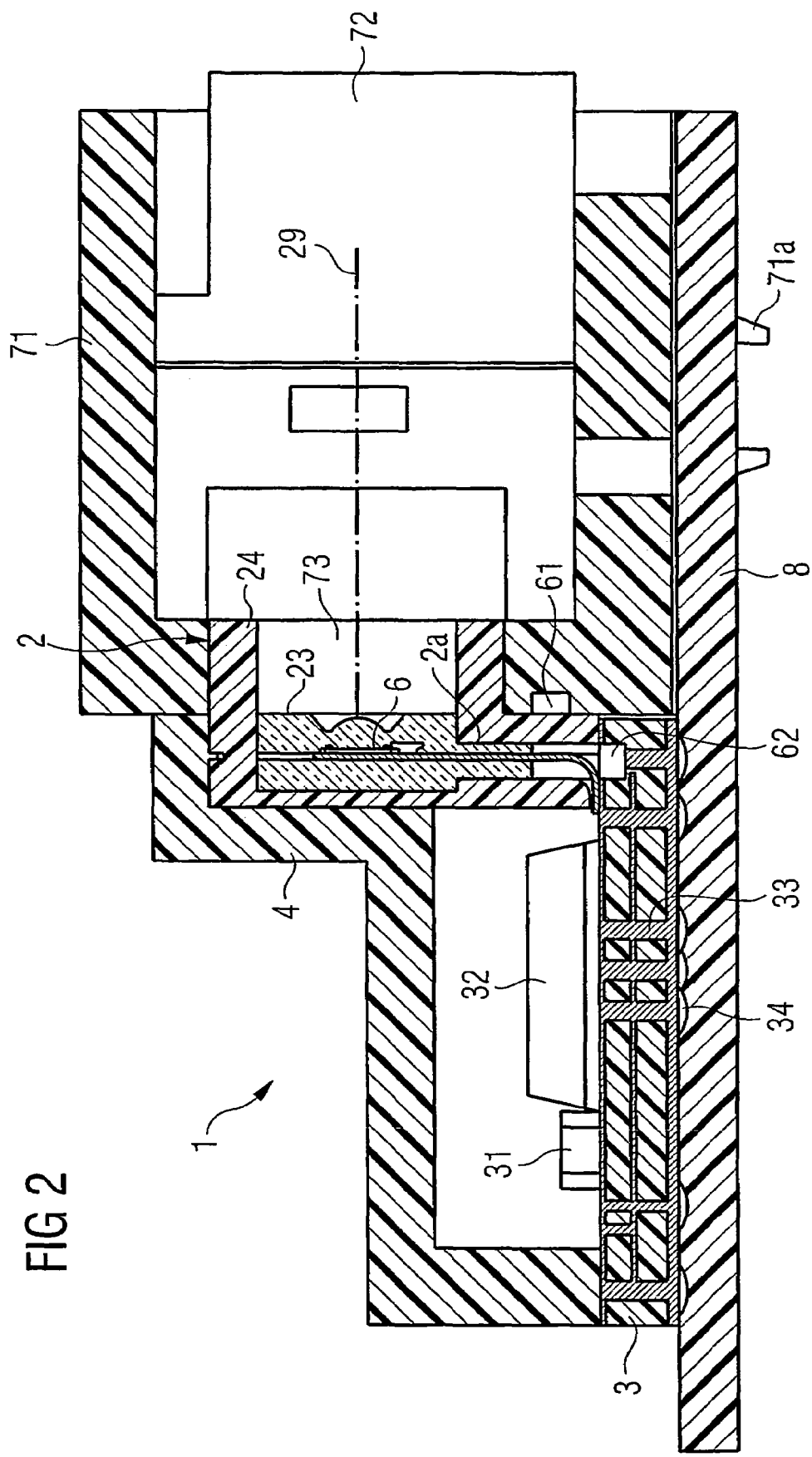
FIG. 2 shows the exemplary embodiment shown in FIG. 1, with the module being coupled to a plug housing.

Self-adjustment markings 61, 62 are furthermore provided on the CAI housing and on the submount and are used for self-adjustment and coupling of the CAI housing 2 to the submount 3 and, respectively, to a plug housing which is coupled to the outer wall of the CAI housing 2 (see FIG. 2).

The submount 3 is a printed circuit board which has at least two layers and contains external circuit 31 as well as an IC driver module or a receiving module (control circuit) 32. The external circuitry 31 is used for power optimization, and is used in particular when RCLEDs are used as transmitting elements.

The submount 3 has two or more plated holes 33 to solder pad contacts 34 on the lower face of the submount, via which the submount can be arranged on a main circuit board (see FIG. 2). Very good heat dissipation takes place by means of the plated holes 33 from the transmitting module or receiving module 32 to a main circuit mount, which is used as heat sink that is coupled to the submount 3.

All of the pad contacts 34 are formed on the lower face of the submount. There is an offset between the contacts 34, so that they are very compact with respect to one another while at the same time being as far away from one another as possible. Additional adjustment pins, advantageously at ground potential, may optionally be provided, and ensure that the submount fits precisely into a main circuit mount.

The submount 3 runs on a plane which is arranged parallel to the optical axis 29 of the CAI housing.

The CAI housing 2 and the housing cover 4 have a metallically conductive surface which, together with the ground layer on the submount, provides EMC shielding.

For this purpose, it is feasible for the CAI housing 2 and the housing cover 4 to be formed from an electrically conductive plastic material.

FIG. 2 shows the optoelectronic module from FIG. 1 in conjunction with an SMI plug arrangement for plastic fiber transmission paths. SMI is short for "small multimedia interface" and is a conventional standard in the in-house field.

However, in principle, other plug systems may also be used in conjunction with the optoelectronic module 1, in particular the plug system which is explained in the following text with reference to FIGS. 6 to 9.

The SMI plug housing 71 is plugged onto the cylinder 24 on the CAI housing 2. The figure shows a plan view of the inserted plug 72. As can be seen, a fiber 73, which is guided in the lug 72, is inserted into the cylindrical holding opening 25 in the CAI housing 2, and its end surface makes mechanical contact with the fiber stop ring 23 on the encapsulation body 21.

It should be mentioned that the plug housing 71 is arranged on a main circuit mount 8 on which the submount 3 is also located. The plug housing 71 in this case latches into the main circuit mount 8 via latching elements 71a.

As can also be seen, the self-adjustment marking 61 is used for connection and passive adjustment between the CAI housing 2 and the plug housing 71.

In this context, it should be mentioned that the CAI housing 2 has a side opening 2a, through which the mount 5 can be inserted together with the transmitting and/or receiving element 6 into the CAI housing 2.

The CAI housing is also filled with encapsulation material via this opening 2a. While the CAI housing 2 is being filled with encapsulation material, a filling closure is inserted into the holding opening 25, and is removed again once the encapsulation material has cured. This filling closure is a negative of the shape of the lens 22 which is associated with the transmitting and/or receiving element 6.

The exemplary embodiment in FIG. 3 shows an alternative refinement of an optoelectronic module 1' connected to a plug housing 71'. In this refinement, the submount 3 is placed underneath the CAI housing 2, and on the lower face of the plug housing 71'.

In order to create sufficient space on the lower face, the height of the plug housing 71 in this case had to be adapted, that is to say the distance between the optical axis 29 and the main circuit mount 8 is somewhat enlarged. However, in comparison to the exemplary embodiment shown in FIGS. 1 and 2, the overall physical length of the optoelectronic module 1' is considerably reduced.

The lower face 71a' of the plug housing 71' is metalized, so as to provide EMC shielding for the electronic components 32 and 31.

It should be mentioned that the lower end 51 of the mount 5 is bent up in the other direction in this refinement.

The CAI housing 2 is fixed on the plug housing 71' by means, for example, of a clamp 71b' on the plug housing 71', which clasps one edge of the CAI housing 2 in an interlocking manner.

Figure 4A:
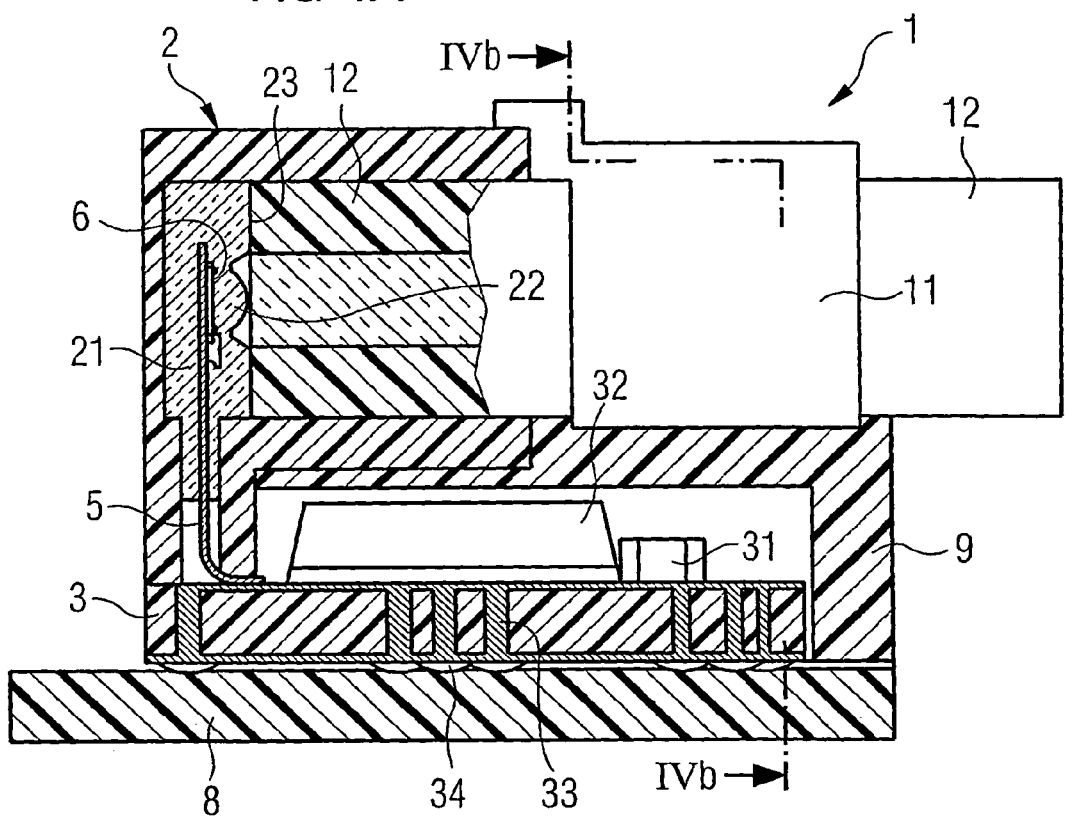
FIG. 4A shows a third exemplary embodiment of an optoelectronic module, in which the module is coupled to a naked fiber adaptor.
Figure 4B:
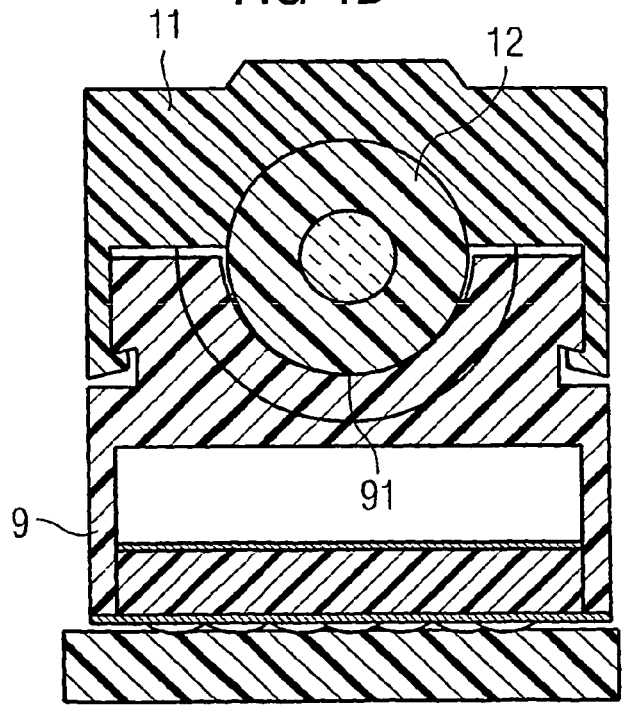
FIG. 4B shows a cross section through the module shown in FIG. 4A.

FIGS. 4A and 4B show one embodiment of an optoelectronic module, in which the plug housing in FIGS. 2 and 3 is replaced by a naked fiber adaptor 9.

FIG. 4A shows a schematic longitudinal section, corresponding to the illustration shown in FIGS. 1 to 3. FIG. 4B shows a cross section along the line IVb-IVb in FIG. 4A.

The CAI housing 2 is in this case pushed into the naked fiber adaptor 9. In principle, the CAI housing 2 and the naked fiber adaptor 9 may also be integral. An optical fiber 12 is inserted into the CAI housing 2, and is firmly clamped by means of a clamp 11 in an area 91 of the naked fiber adaptor 9 which is in the form of a trough.

The inner face of the clamping apparatus 11, the configuration of the trough shape and the fixing of the clamping apparatus in the naked fiber adaptor 9 are designed so as to prevent the fiber 12 from being pulled back.

Provision is advantageously made for the clamp 11 to cover the open end of the cylindrical CAI housing 2, thus preventing it from becoming dirty.

Instead of fixing in the adaptor area, a clamping apparatus (cutting clamp) can alternatively by provided in the area of the fiber coupling in the CAI housing itself.

Figure 5:
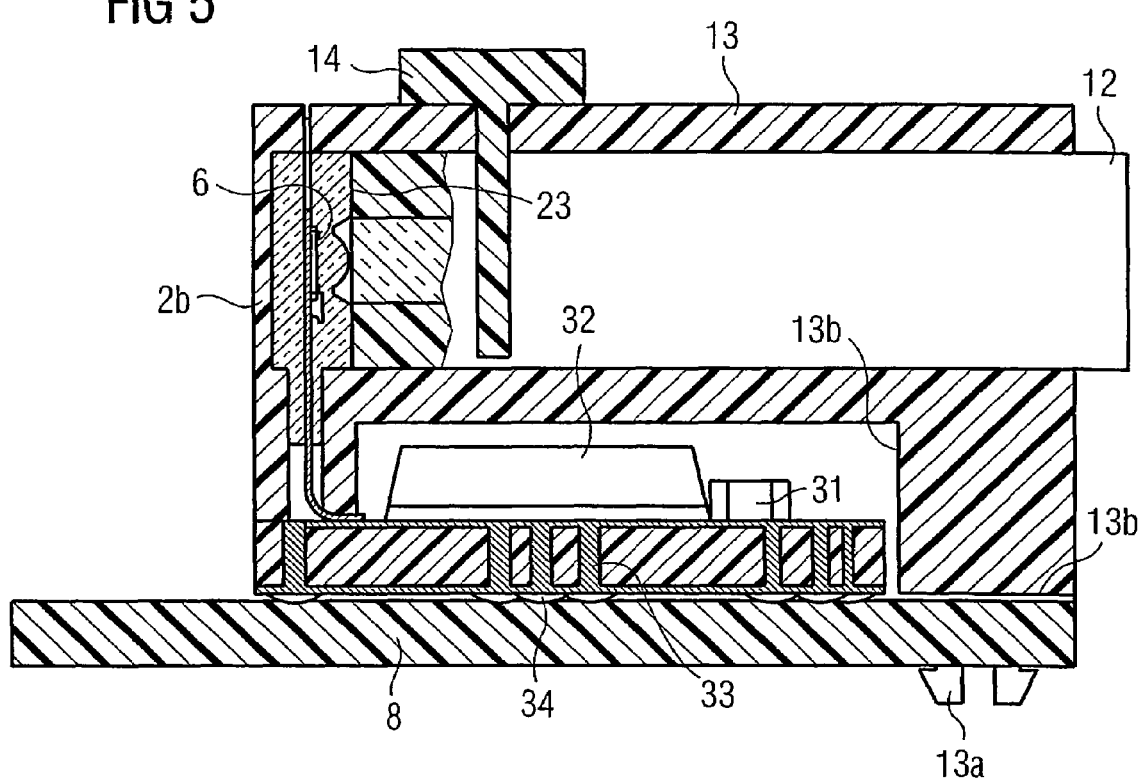
FIG. 5 shows a fourth exemplary embodiment of an optoelectronic module, with the module forming a naked fiber adaptor.

FIG. 5 shows a further embodiment variant with a naked fiber connection, with the CAI housing and the naked fiber adaptor forming an integral molding 13. The molding 13 is coated with a metallically conductive layer, thus providing EMC shielding for the transmitting and/or receiving element. The optical waveguide 12 is fixed by means of a clamping apparatus 14, which clasps the casing of the inserted optical waveguide 12.

The molding 13 is firmly connected to the main circuit board 8 by means of clamping elements 13a. The lower face 13b is once again metalized, for electromagnetic shielding.

It should be mentioned that the illustrated embodiment of the CAI housing may also be combined with a naked fiber connection in the case of an embodiment in which the submount 3 is arranged alongside the CAI housing rather than underneath it, as is illustrated in FIGS. 1 and 2.

Figure 6A:
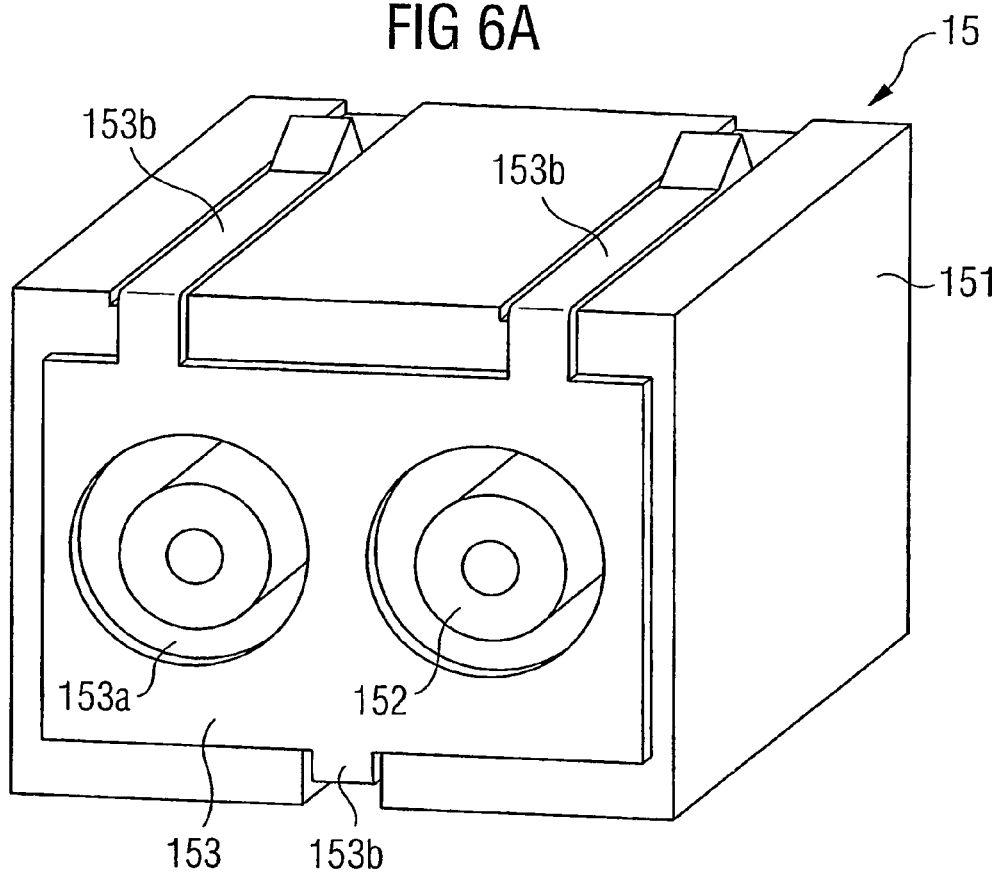
FIG. 6A shows a perspective view of the plug of a plug arrangement for POF transmission systems.
Figure 6B:
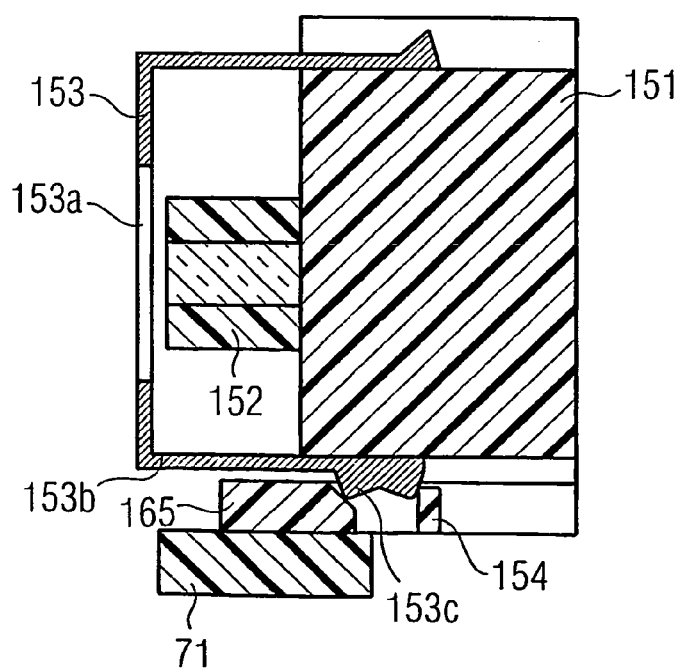
FIG. 6B shows a section view of the plug shown in FIG. 6A.

FIGS. 6A, 6B show a novel plug for a plug arrangement which is preferably connected to the CAI transceiver 2 in the optoelectronic module in FIGS. 1 to 5.

The plug 15 has a housing 151 with two plastic optical fibers 152, which are separated from one another by 5 mm, and a protective bracket 153.

When the plug 15 is not inserted, the protective bracket 153 is positioned in front of the end surfaces of the optical fibers 152, so that the optical fiber ends which project out of the housing 151 are protected by the protective bracket 153. The protective bracket has a cutout 153a in the area of each of the optical fibers 152.

Furthermore, the protective bracket 153 has three attachment arms 153b, by means of which it is attached to the housing 151 of the plug such that it can move. The attachment arms 153b are in this case guide in the corresponding grooves or holders in the housing 151, sprung by means of their geometric configuration.

As can be seen from the side view in FIG. 6B, the plug 15 has a locking part 154 for detachably locking the attachment arms 153b. an unlocking part 165, which, for example, is in the form a web on the plug housing 71, 71', 16, allows the lock to be released by lifting the attachment arms 153b.

Figure 6C:
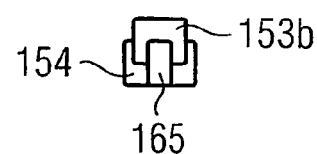
FIG. 6C shows a plan view of the locking apparatus between the plug and plug housing shown in FIG. 6B.

FIG. 6c shows a plan view of the locking apparatus shown in FIG. 6b along the direction in which the unlocking part 165 extends, illustrated separately. As can be seen, the attachment bracket 153b which is associated with the unlocking part 165 has a latching tab 153c with engages over the unlocking part 165. The latching tab 153c interacts with the locking part 154 in order to unlock the plug 15 and plug housing 16.

FIG. 7 shows a plug housing 16 associated with the plug 15 shown in FIGS. 6A and 6B.

The plug housing 16 has three steps. A first step 161 is used to accommodate and hold a CAI housing 2 as shown in FIGS. 1 to 5.

A second step 162 is used to guide the protective bracket 153 of the plug 15. The stop 163 which is formed between the first and second steps represents a stop for the protective bracket 153 of the plug 15. The third step 164 is used to guide the actual plug 15 and the housing 151 of the plug 15.

The first step is in the form of a circular opening, whose diameter corresponds to the external diameter of the cylinder 24 of the CAI housing 2. The second step is rectangular, corresponding to the external shape of the protective bracket 153. The third step is likewise rectangular, corresponding to the cuboid shape of the housing 151 associated with the plug 15.

Figure 8:
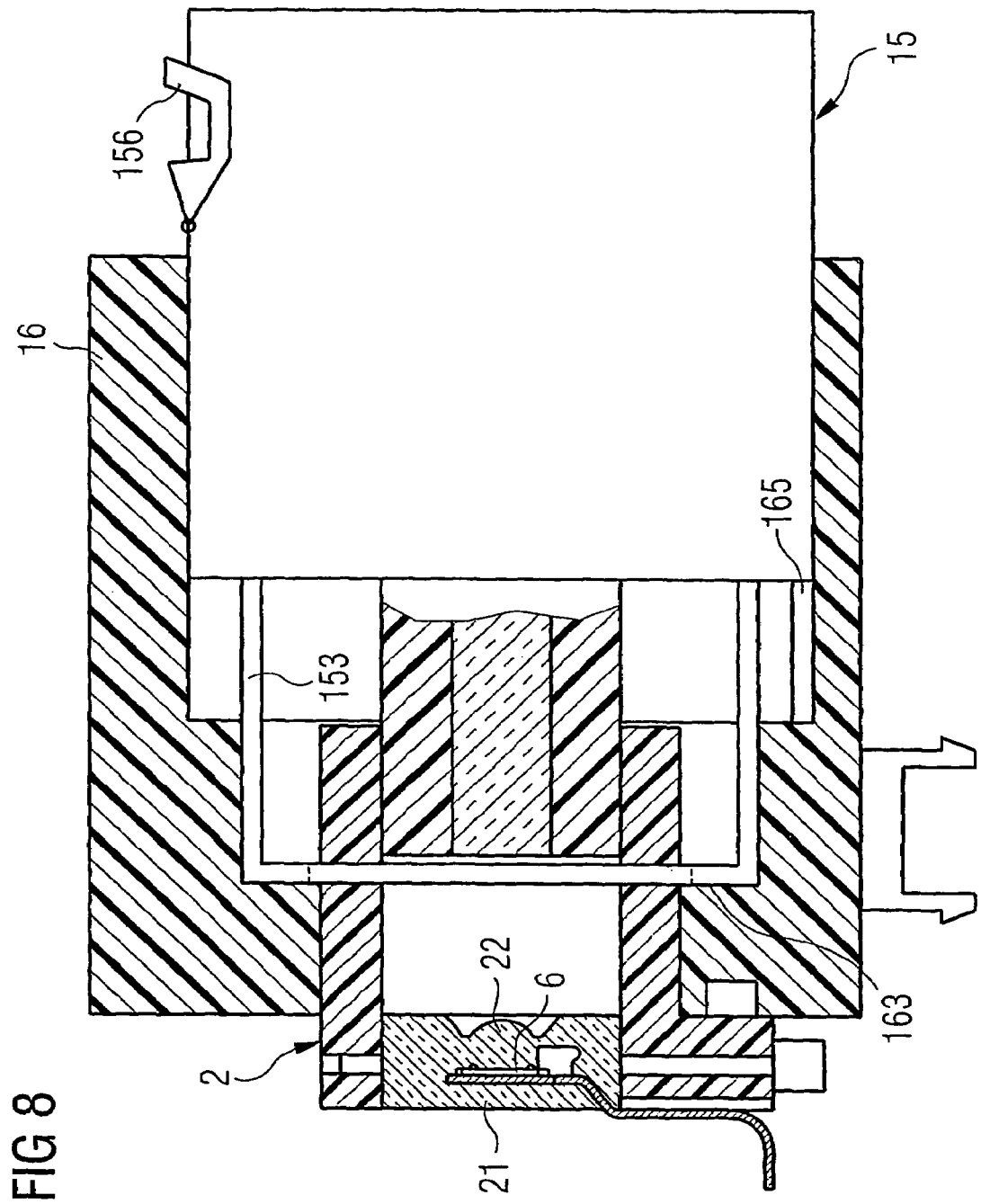
FIG. 8 shows the connection between a plug as shown in FIGS. 6A, 6B and a plug housing as shown in FIG. 7 in a position which the lug has not yet been completely inserted into the plug housing.

FIG. 8 shows the CAI housing 2 as shown in FIGS. 1 to 5, mounted in the plug housing 16. The plug 15 has at this stage been inserted sufficiently into the plug housing 16 that the protective bracket 153 is resting on the protective bracket stop 163.

FIGS. 7 and 8 likewise show an unlocking part 165 for unlocking the protective bracket 153, illustrating, likewise schematically, a plug lock 156 by means of which the completely inserted plug 15 is latched to the plug housing 16. The plug 156 may, of course, also be used for unlocking.

Figure 9:
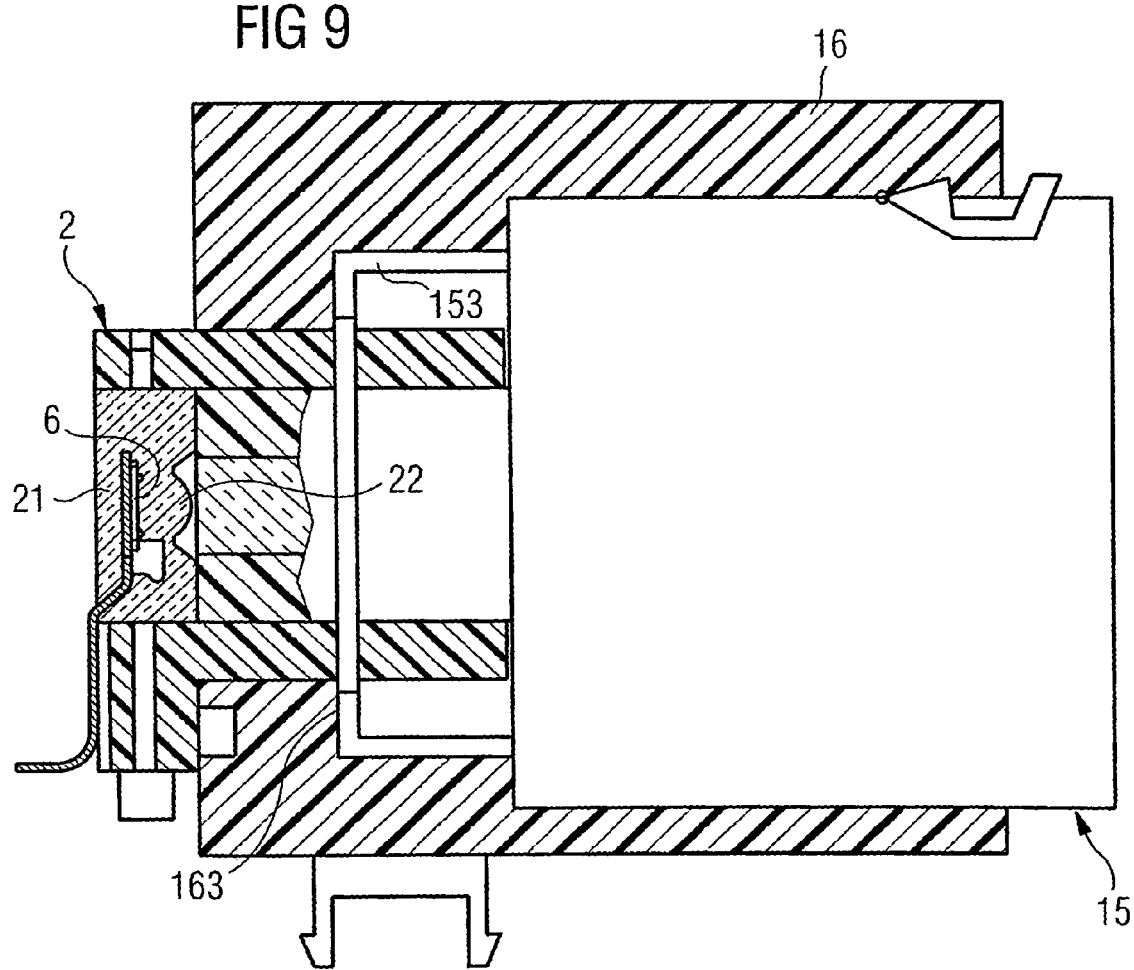
FIG. 9 shows a plug arrangement as shown in FIG. 8, with the plug having been completely inserted into the plug housing.

FIG. 9 shows the plug 15 after it has been completely inserted into the plug housing 16. As can be seen from the figure, the protective bracket 153 has been inserted further into the housing 151 of the plug 15 from the position shown in FIG. 8. The end surface of the optical waveguide 152 accordingly projects out of the opening 153a in the protective bracket 153, and rests directly on the encapsulation part 21 of the CAI housing 2. This satisfies the "Kuchiri" criterion.

The invention therefore provides for the protective bracket 153 to be pulled back into the housing 151 of the plug 15 as soon as it reaches the step stop 163 on the plug housing 16. The movement distance is designed precisely such that the fiber 152 is placed in front of the integrated lens 22 in the encapsulation body 21, and the plug 15 is latched in at the same time. The unlocking mechanism must then be released before the plug 15 can be removed from the plug housing 16 again.

The shapes and additional structures of the lower attachment arm 153b and of the unlocking part 165 can be designed such that the lower attachment arm 153b is forced out of the plug housing 16 while the plug 15 is being pulled out. The protective bracket 153 is thus pulled out of the housing 151 of the plug 15 until the lower attachment 153b is once again locked on the locking device 154 (see FIG. 6B). This may be achieved with spring assistance or by mechanical parts engaging in one another, with these mechanical parts also being moved by the mechanical pulling movement of the lower attachment arm 153b.

Figure 10:
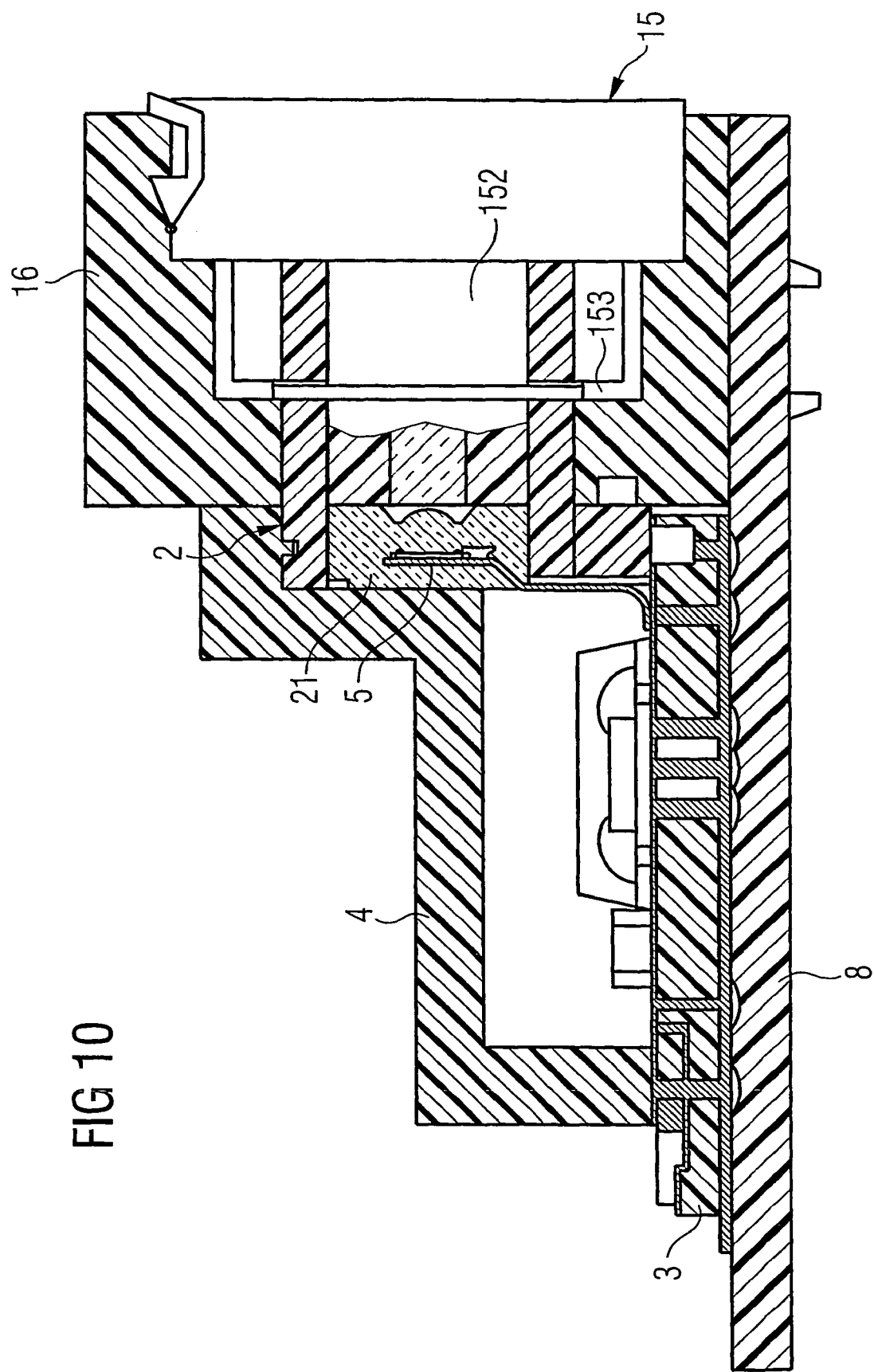
FIG. 10 shows an optoelectronic module as shown in FIG. 1, connected to a plug arrangement as shown in FIGS. 6 to 9.
Figure 11:
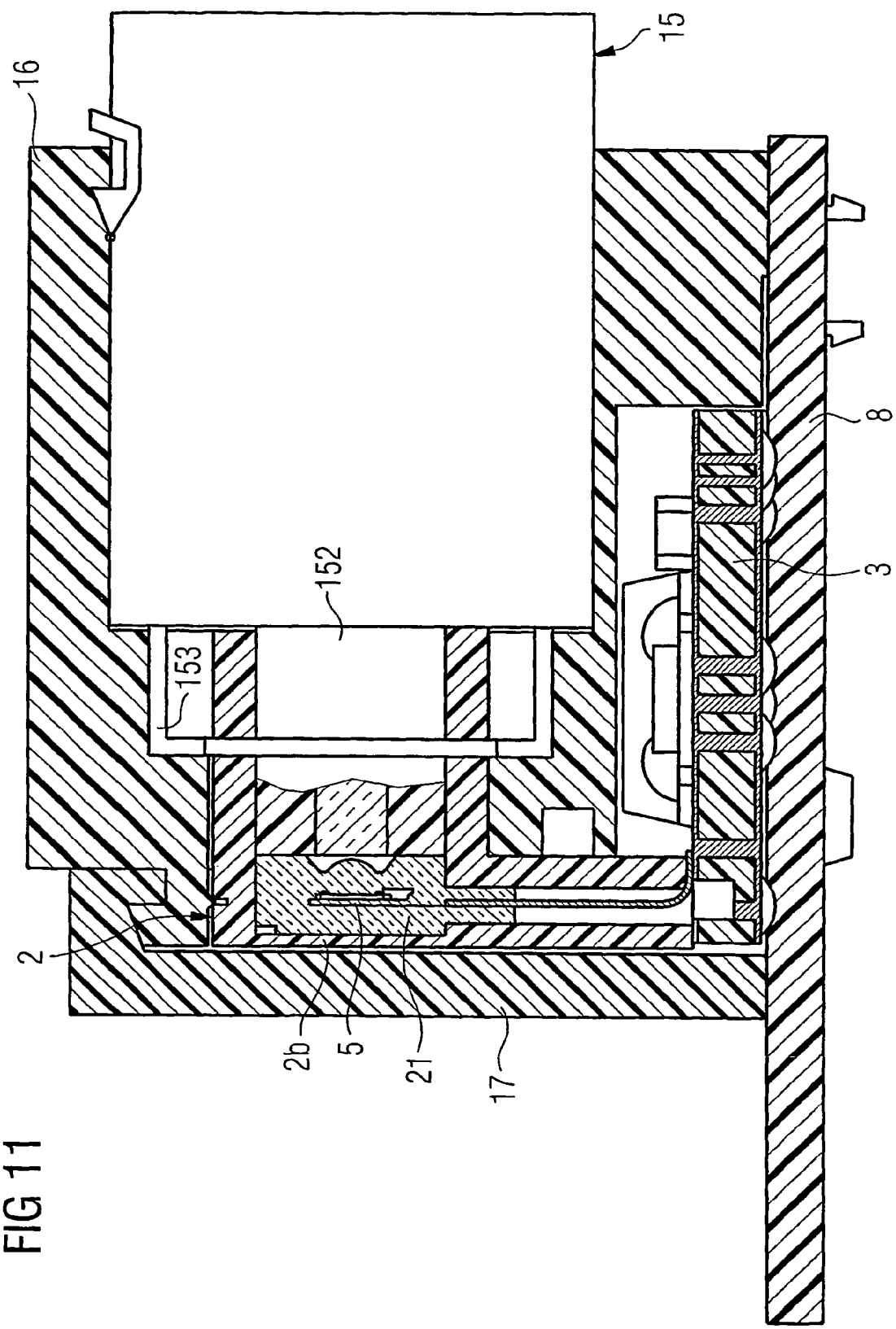
FIG. 11 shows an optoelectronic module as shown in FIG. 3, connected to a plug arrangement as shown in FIGS. 6 to 9.

FIGS. 10 and 11 show the novel plug arrangement, as described above, in conjunction with an optoelectronic module 1 as illustrated in FIGS. 1 and 3, respectively. The figures each show the final position, with the plug 15 completely inserted into the plug housing 16.

In this case, with regard to the exemplary embodiment shown in FIG. 10, it should also be noted that the external dimensions of the plug housing 16 are such that the plug housing 16 comes to rest on the main circuit board 8. It should also be mentioned that the transparent encapsulation body 21 in this exemplary embodiment represents a side wall for the cylindrical CAI housing 2. In this case, the CAI housing 2 is a cylinder which is open at both ends, with one end of the cylinder being closed by the encapsulation body 21. The mount 5 is in this case bent into an S shape, so that it is completely surrounded by the encapsulation body 21.

With regard to the exemplary embodiment shown in FIG. 11, it should be noted that a preferably metalized protective cap 17 is additionally connected in an interlocking manner firstly to the plug housing 16 and secondary to the main circuit board 8. In this exemplary embodiment, the mount 5 is straight.

Because the mount 5 is straight, it is possible to use a version of the CAI housing 2 in which one end of the cylindrical CAI housing 2 is closed by a housing cover 4, 2b, as is illustrated in FIGS. 1 to 5, 10 and 11.

What is claimed is:

1. An optoelectronic module comprising:
   a transmitting and/or receiving element,
   a mount for supporting the transmitting and/or receiving element,
   a holding and coupling part for receiving the transmitting and/or receiving element and which is at least partially filled with an encapsulation material, and which has a coupling area for receiving an optical waveguide, and
   an electrical drive and/or receiving circuit coupled to the transmitting and/or receiving element,
   wherein the encapsulation material surrounds the transmitting and/or receiving element and is located at least partially in the holding and coupling part,
   wherein the encapsulation material forms an integrated lens on the side facing the coupling area,
   wherein electrical drive and/or receiving circuit is arranged outside the holding and coupling part on a submount, which lies on a plane that runs parallel to the longitudinal axis of the coupling area, and
   wherein the mount is arranged at right angles to the submount.

2. The module as claimed in claim 1, wherein a fiber stop ring is formed in the encapsulation material around the lens and prevents the end surface of an optical fiber which is inserted into the coupling area from touching the lens apex.

3. The module as claimed in claim 1, wherein the submount is mounted on a main circuit board.

4. The module as claimed in claim 1, wherein the submount is mounted on a main circuit board as a surface mount device.

5. An optoelectronic module comprising:
   a transmitting and/or receiving element,
   a mount for supporting the transmitting and/or receiving element,
   a holding and coupling part for receiving the transmitting and/or receiving element and which is at least partially filled with an encapsulation material, and which has a coupling area for receiving an optical waveguide, and
   an electrical drive and/or receiving circuit coupled to the transmitting and/or receiving element,
   wherein the encapsulation material surrounds the transmitting and/or receiving element and is located at least partially in the holding and coupling part,
   wherein the electrical drive and/or receiving circuit is arranged outside the holding and coupling part on a submount, which lies on a plane that runs parallel to the longitudinal axis of the coupling area, wherein the mount is arranged at right angles to the submount, wherein the submount is mounted on a main circuit board as a surface mount device, and wherein the main circuit board is used as a heat sink for the submount and/or for the electrical drive and/or receiving circuit which is arranged on the submount, with the submount having plated holes which are also used for heat conduction.

6. The module as claimed in claim 5, wherein the holding and coupling part forms of cylindrical cutout, one of whose ends contains the transmitting and/or receiving element, and whose other end forms the coupling area for an optical waveguide.

7. The module as claimed in claim 5, wherein the mount is fitted only with the transmitting and/or receiving element or with the transmitting element and a monitor diode.

8. The module as claimed in claim 5, wherein the mount is a leadframe, which provides an electrical link for the transmitting and/or receiving element and is electrically connected to the submount.

9. The module as claimed in claim 8, wherein the leadframe runs at right angles to the longitudinal axis of the coupling area, at least in the area of the holding and coupling part.

10. The module as claimed in claim 5, wherein the module is mechanically coupled to a plug housing.

11. The module as claimed in claim 5, wherein the module is mechanically coupled to a naked fiber adaptor.

12. The module as claimed in claim 11, wherein an optical fiber is firmly clamped by means of a clamp in an area of the naked fiber adaptor which is in the form of a trough.

13. The module as claimed in claim 11, wherein the naked fiber adaptor is formed by an extension to the cylindrical coupling area.

14. The module as claimed in claim 5, wherein the holding and coupling part and/or the submount have/has self-coupling structures which allow automatic adjustment of the elements with respect to one another and/or with respect to a main circuit board.

15. The module as claimed in claim 5, wherein a housing cover is provided and surrounds the submount with the electrical drive and/or receiving circuit, and/or that end of the holding and coupling part which faces away from the coupling area.

16. The module as claimed in claim 5, wherein the holding and coupling part and/or the housing cover are/is provided with an electrically conductive layer, and/or are/is composed of a conductive plastic material.

17. The module as claimed in claim 5, wherein the holding and coupling part is in a form of a double chamber and, in parallel, separate areas, has firstly a transmitting element and secondly a receiving element, each of which can be coupled via a separate coupling area to an optical fiber.

18. The module as claimed in claim 1, wherein the submount is arranged underneath the coupling area of the holding and coupling part.

* * * * *

UNITED STATES PATENT AND TRADEMARK OFFICE
CERTIFICATE OF CORRECTION

PATENT NO. : 7,371,012 B2  Page 1 of 1
APPLICATION NO. : 10/507298
DATED : May 13, 2008
INVENTOR(S) : Nikolaus Schunk It is certified that error appears in the above-identified patent and that said Letters Patent is hereby corrected as shown below:

Column 1, line 65: please replace the word "lug" with the word --plug--.
Column 2, line 66: please replace the word "lane" with the word --plane--.
Column 4, line 3: please replace the word "The" with the word --This--.
Column 5, line 56: please replace the word "lug" with the word --plug--.
Column 6, line 21: please replace the word "other" with the word --one--.
Column 7, line 24: please replace the word "lug" with the word --plug--.
Column 8, line 60: please replace the word "an" with the word --An--.
Column 8, line 67: please replace the word "with" with the word --which--.
Column 12, line 26, claim 18: please replace the dependent claim "1" with the
     dependent claim --5--.

Signed and Sealed this

Eleventh Day of November, 2008

JON W. DUDAS
*Director of the United States Patent and Trademark Office*